US005572041A

United States Patent [19]

Betsui et al.

[11] Patent Number: 5,572,041

[45] Date of Patent: Nov. 5, 1996

[54] FIELD EMISSION CATHODE DEVICE MADE OF SEMICONDUCTOR SUBSTRATE

[75] Inventors: Keiichi Betsui; Osamu Toyoda; Shin'ya Fukuta, all of Kawasaki, Japan

[73] Assignee: Fujitsu Limited, Kawasaki, Japan

[21] Appl. No.: 121,538

[22] Filed: Sep. 16, 1993

[30] Foreign Application Priority Data

Sep. 16, 1992 [JP] Japan .................................... 4-246662

[51] Int. Cl.[6] .............................. H01L 29/06; H01J 1/02; H01J 9/04; H01J 1/46

[52] U.S. Cl. ................................ 257/10; 445/50; 445/51; 313/307; 313/309; 313/336; 313/351; 345/74

[58] Field of Search .............................. 257/10; 313/306, 313/307, 308, 309, 336, 351, 366, 465; 315/169.2, 341, 169.3; 445/50, 51; 345/74

[56] References Cited

U.S. PATENT DOCUMENTS 5,176,557 1/1993 Okunuki et al. .......................... 445/50

FOREIGN PATENT DOCUMENTS

92/04732 3/1992 WIPO ...................................... 445/50

OTHER PUBLICATIONS

Meyer, R., "Recent Development on 'Microtips' Display at LETI," *Technical Digest Of IVMC '91*, Nagahama, JP, 1991, pp. 6–9.

*Primary Examiner*—Sara W. Crane
*Assistant Examiner*—Alice W. Tang
*Attorney, Agent, or Firm*—Staas & Halsey

[57] ABSTRACT

A field emission cathode device comprising a semiconductor substrate, a semiconductor cathode electrode layer, emitter tips formed on the cathode electrode layer to emit electrons therefrom, and a gate electrode layer formed on an insulating layer. Each of the emitter tips is arranged in the aligned apertures of the gate electrode layer and the insulating layer. To electrically isolate two adjacent cathode electrode lines from each other, the cathode electrode layer is made of a semiconductor having a conductivity type different from that of the substrate. Alternatively, the cathode electrode is made of a semiconductor having the same conductivity type as that of the substrate, and in this case, a portion between two adjacent cathode electrode lines is made of a heavily doped semiconductor so as to electrically isolate two adjacent cathode electrodes.

22 Claims, 11 Drawing Sheets

FIELD EMISSION CATHODE DEVICE MADE OF SEMICONDUCTOR SUBSTRATE

BACKGROUND OF THE INVENTION

1. Field of the Invention

The present invention relates to a field emission cathode device made of a semiconductor substrate.

2. Description of the Related Art

The field emission cathode device is a source of electrons and comprises a cathode electrode layer, an emitter tip (or emitter tips) having a conical shape and formed on the cathode electrode layer, and a gate electrode layer arranged above the cathode electrode layer with an insulating layer arranged between the cathode electrode layer and the gate electrode layer. The insulating layer and the gate electrode layer have respective, aligned apertures in which each corresponding emitter tip is arranged. The distal end of the emitter tip is at the level of the inner wall of the aperture in the gate electrode. A field is created near the distal end of the emitter tip to induce emission of electrons therefrom when a voltage is applied between the cathode electrode layer and the gate electrode layer.

The field emission cathode device can be fabricated, in a very small size, by processes such as etching or vapor deposition used for fabricating semiconductor devices, and can be used, for example, in a micron-size vacuum tube (micro-vacuum-tube). Electrons in the field emission cathode device have a higher mobility than those in a semiconductor device, and the field emission cathode device offers high-speed operation at a high temperature and is resistant to damage by radiation. With these characteristics, the field emission cathode device can be expected to be used in a variety of applications, such as a microwave element, a super-high-speed arithmetic element, in radioactive or high-temperature environments, or as a display device.

The display device includes a plurality of emitter tips, used as electron guns, for constituting a plurality of pixels or light emitting elements (LEEs). For example, the article entitled "Recent Development on Microtip Displays at Leti" in the Technical Digest of IVMC '91 discloses a flat display device comprising a field emission cathode device including a plurality of micro electron guns and a phosphor display as an anode. The field emission cathode device comprises a glass substrate, a cathode electrode layer formed on the glass substrate, and a gate electrode layer arranged above the cathode electrode layer via an insulating layer. The cathode electrode layer includes a plurality of elongated strip-like cathode electrodes (cathode lines) extending in parallel to each other, and the gate electrode layer includes a plurality of elongated strip-like gate electrodes (gate lines) extending in parallel to each other and perpendicular to the cathode electrodes for and constituting a matrix with the cathode electrodes. The intersections of the cathode and gate electrodes constitute corresponding LEE regions. A plurality of emitter tips is provided on each of the LEE regions.

Since a glass substrate is used in this prior art, it is possible to form the cathode electrodes directly on the glass substrate without any insulation between two adjacent cathode electrodes. It is, however, desired that the substrate and the cathode electrodes be made of a semiconductor material so as to best utilize semiconductor fabricating processes. However, it is not possible to form a cathode electrode layer, comprising a plurality of cathode electrodes, directly on the semiconductor substrate since the semiconductor is conductive.

SUMMARY OF THE INVENTION

The object of the present invention is to provide a field emission cathode device comprising a semiconductor substrate and a cathode electrode layer, including a plurality of cathode electrodes, which is formed directly on the semiconductor substrate.

According to the present invention, there is provided a field emission cathode device comprising: a semiconductor substrate; a cathode electrode layer made of a semiconductor and formed on the substrate, the cathode electrode layer including a plurality of cathode electrode groups, each of the cathode electrode groups including a plurality of cathode electrodes; at least one emitter tip formed on each of the cathode electrodes; an insulating layer formed on the substrate and having a plurality of apertures; a gate electrode layer formed on the insulating layer and having a plurality of apertures respectively in alignment with the plurality of apertures of the insulating layer, each of the emitter tips being arranged in a corresponding pair of the aligned apertures of the gate electrode layer and the insulating layer; and means for electrically isolating two adjacent cathode electrode groups from each other.

In one of the preferred embodiments, the means for electrically isolating two adjacent cathode electrode groups comprises a difference in the conductivity type of the semiconductors of the cathode electrode layer and the substrate in which the cathode electrode layer is formed with a semiconductor having a conductivity type different from that of the substrate.

In another preferred embodiment, the means for electrically isolating two adjacent cathode electrode groups comprises means for enhancing a threshold voltage determining a mobility of electrons in the substrate at a position between two adjacent cathode electrodes when a voltage is applied between one of the cathode electrodes and the gate electrode layer.

In the latter case, the means for enhancing a threshold voltage preferably comprises a portion of a semiconductor arranged between the substrate and each of the cathode electrodes and having a conductivity type different from that of the substrate, and the portion of the semiconductor is heavily doped with an impurity, while the cathode electrode is made of a semiconductor having the same conductivity type as that of the substrate.

Also, in the latter case, the cathode electrode layer is preferably formed of a semiconductor having a conductivity type different from that of the substrate, and the means for enhancing the threshold voltage comprises a portion of a semiconductor arranged between two adjacent cathode electrodes and having the same conductivity type as that of the substrate but heavily doped with an impurity.

Alternatively, the cathode electrode layer is preferably formed of a semiconductor having a conductivity type different from that of the substrate, and the means for enhancing the threshold voltage comprises a portion of an insulating material arranged between two adjacent cathode electrodes. Alternatively, the cathode electrode layer is preferably formed of a semiconductor having a conductivity type different from that of the substrate, and the means for enhancing a threshold voltage comprises a cavity arranged in the substrate between two adjacent cathode electrodes.

Further, the present invention provides a flat display apparatus comprising a field emission cathode device adapted to emit electrons, and a display adapted to receive electrons emitted from the field emission cathode device to produce an image thereon. The field emission cathode device comprises: a semiconductor substrate; a cathode electrode layer made of a semiconductor and formed on the substrate, the cathode electrode layer including a plurality of strip-like cathode electrode lines extending in parallel to each other, each of the cathode electrode lines having a plurality of pixel regions along the length thereof; at least one emitter tip formed on each of the LEE regions of the cathode electrodes; an insulating layer formed on the substrate and having a plurality of apertures; a gate electrode layer formed on the insulating layer and including a plurality of strip-like gate electrode lines extending in parallel to each other and perpendicular to the cathode electrode lines and constituting a matrix with the cathode electrode lines, the gate electrode layer having a plurality of apertures in alignment with the apertures of the insulating layer, respectively, each of the emitter tips being arranged in one pair of the aligned apertures of the gate electrode layer and the insulating layer; and means for electrically isolating two adjacent cathode electrode lines.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
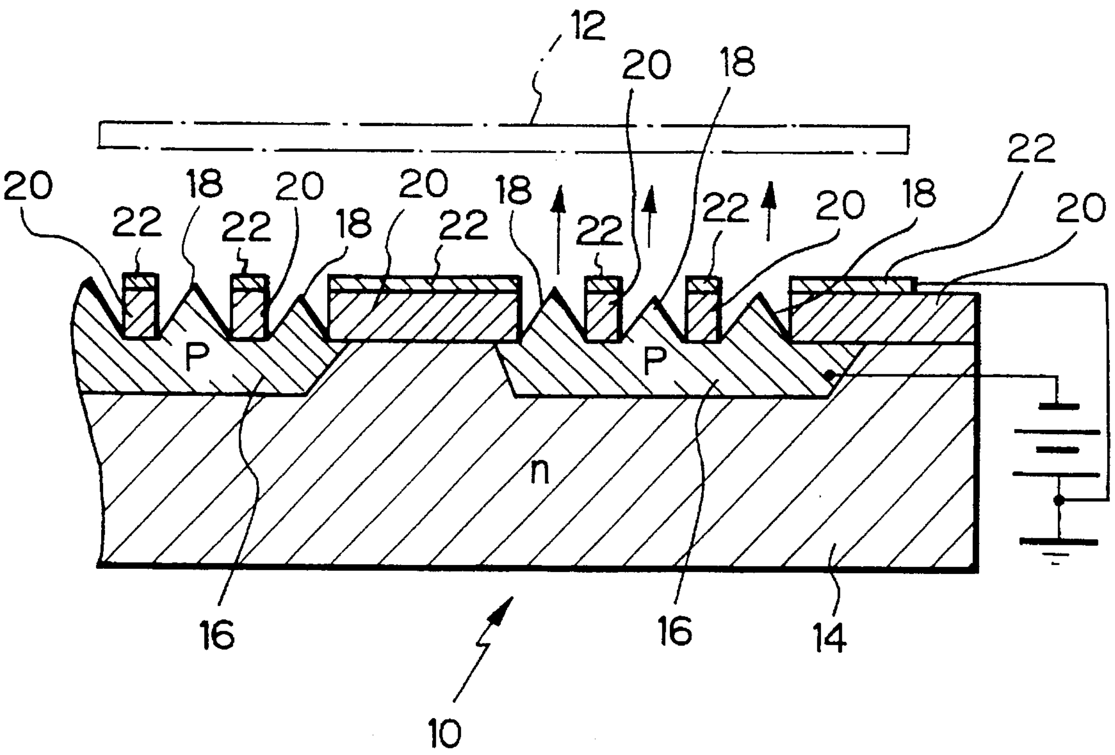
FIG. 1 is a cross-sectional view of a field emission cathode device according to the embodiment of the present invention.
Figure 2:
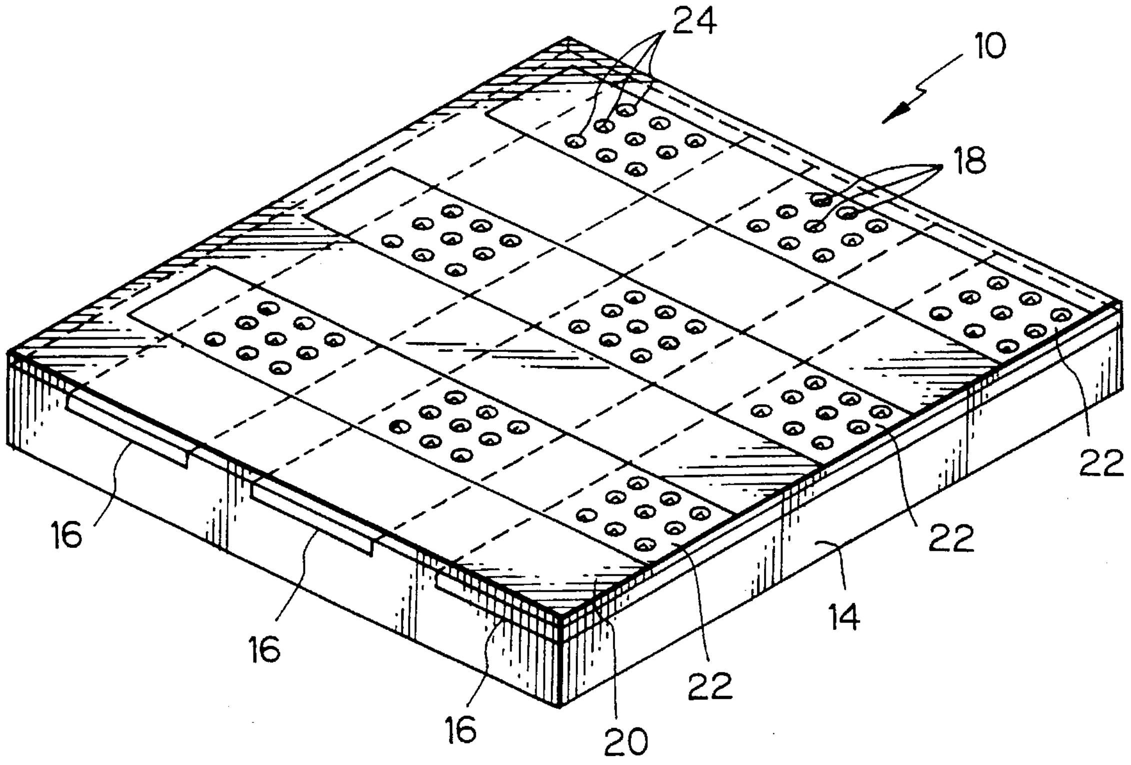
FIG. 2 is a perspective view of the field emission cathode device of FIG. 1.
Figure 3:
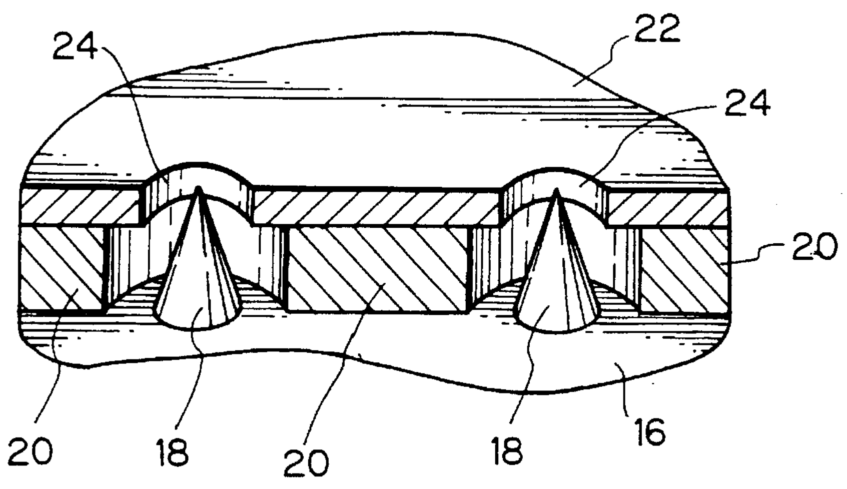
FIG. 3 is a partial, enlarged and cross-sectional view of the field emission cathode device of FIG. 1.

FIGS. 1 to 3 show a field emission cathode device 10 according to the first embodiment of the present invention. The field emission cathode device 10 is arranged, for example, in an opposing relationship to an anode 12 and housed in a vacuum tube so that electrons emitted from the field emission cathode device 10 travel to the anode 12.

As shown in FIG. 1, the field emission cathode device 10 includes a n-type silicon substrate 14 and a p-type silicon cathode layer, comprising plural cathode electrodes 16 arranged in spaced, parallel relationship directly on the silicon substrate 14. Emitter tips 18 having a conical shape are formed on each of the cathode electrodes 16. As shown in FIG. 2, the cathode electrodes 16 have an elongated strip-like shape, extending as cathode electrode lines in parallel to each other.

In the embodiment of FIG. 1, the emitter tips 18 can be formed by shaping the surface of the cathode electrodes 16 into plural conical shapes after the cathode electrodes 16 are formed on the silicon substrate 14. It is also possible to form the emitter tips 18 on the cathode electrodes 16 separately, for example, by vapor deposition of a metal having a high melting point. Typically, the emitter tips 18 have a height of approximately 2 μm and a diameter at the base of approximately 2 μm. The distance between two adjacent emitter tips 18 within one segment on one cathode electrode 16 is approximately 3 μm, and the distance between adjacent cathode electrodes 16 is approximately 300 μm.

An insulating layer 20 is formed on the substrate 14, covering the cathode electrodes 16. A gate electrode layer having gate electrodes 22 is formed on the insulating layer 20. The gate electrodes 22 have an elongated strip-like shape, as gate electrode lines, and extend parallel to each other and perpendicular to the cathode electrodes 16, to constitute a matrix with the cathode electrodes 16.

In FIGS. 1 to 3, in each of the intersecting regions between the cathode electrodes 16 and the gate electrodes 22, the insulating layer 20 and the gate electrode layer 22 have aligned apertures 24. Each of the emitter tips 18 stands on (i.e., protrudes from) the cathode electrode layer 16 in a corresponding one of the aligned apertures 24. The tip end of each emitter tip 18 is at the level of the inner surface of each of the apertures 24 of the gate electrode layer 22, electrons being emitted at this tip end. The cathode electrodes 16 are connected to the negative terminal of a power source, and the gate electrode layer 22 is connected to the positive terminal of the power source. Accordingly, a field is created at the distal end of the emitter tip 18 to induce emission of electrons therefrom when a voltage is applied between one of the cathode electrodes 16 and the gate electrode layer 22. In this way, electrons emitted from the field emission cathode device 10 travel to the anode 12 (FIG. 1). Also, the insulating layer 20 has apertures (not shown) at the peripheral region of the device and these apertures are filled with conductive elements (not shown) to connect the cathode electrodes 16 to a power supply source at the surface of the insulating layer 20.

Figure 4:
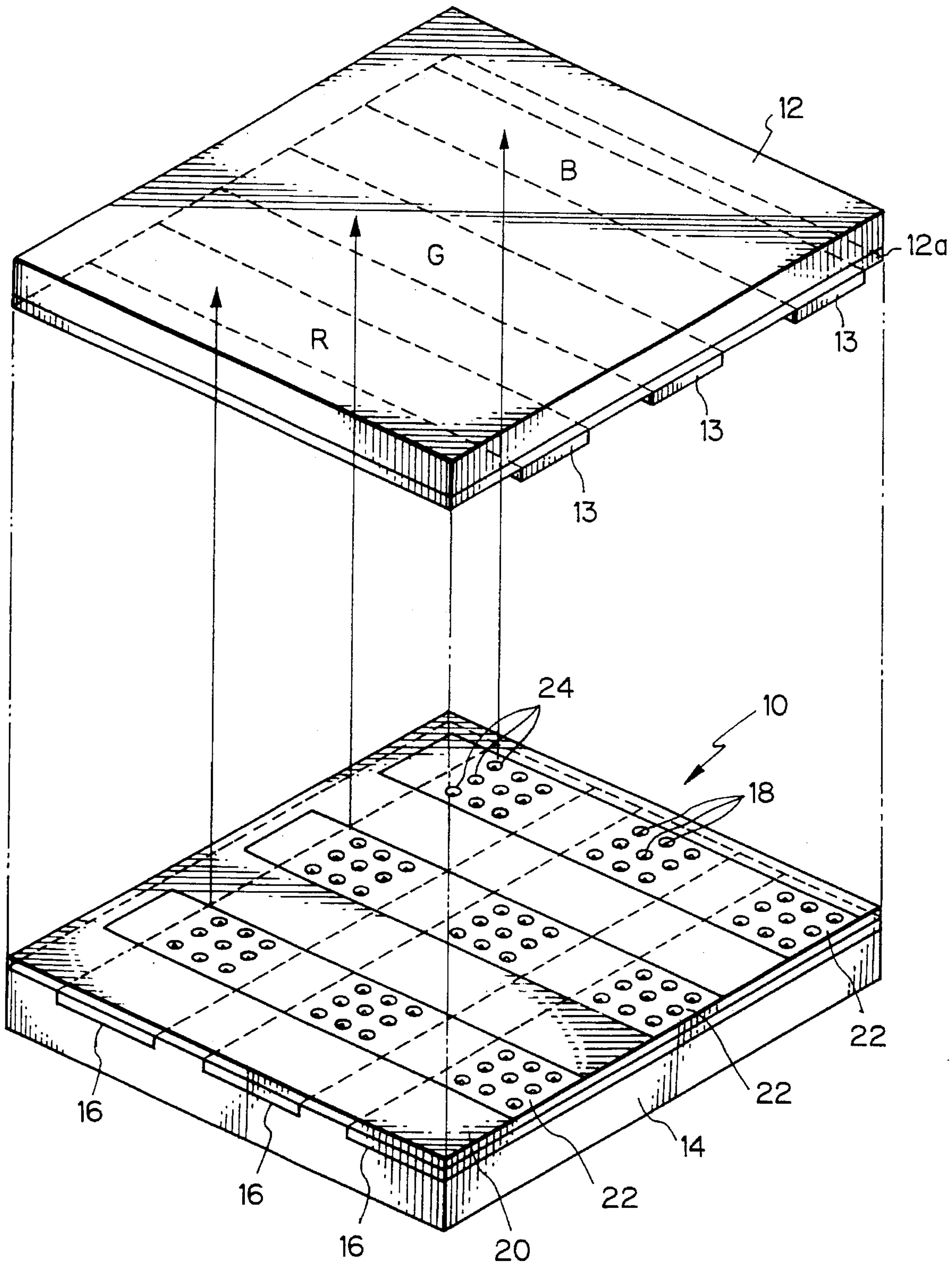
FIG. 4 is a perspective and exploded view of a flat display using the field emission cathode device of FIG. 1.

In the first embodiment, the field emission cathode device 10 is utilized in a flat display, as shown in FIGS. 1, 2 and 4. Nine emitter tips 18 are arranged at each of the intersecting regions between the cathode electrodes 16 and the gate electrodes 22 and constitute one LEE region, as a unit or a segment. The anode 12 includes a common anode electrode 12*a* and a plurality of fluorescent regions 13 producing red, green or blue light.

In FIG. 1, it is shown that three emitter tips 18 are arranged on one cathode electrode 16. Voltage is applied to the right cathode electrode 16 in FIG. 1, and electrons are emitted, as shown by the arrows in FIG. 1. Voltage is not applied to the left cathode electrode 16 in FIG. 1, and electrons are not emitted.

A P-N junction is formed between each of the cathode electrodes 16 and the silicon substrate 14. The silicon substrate 14 is common to all cathode electrodes 16, and the directions of the P-N junctions between the cathode electrodes 16 and the silicon substrate 14 are the same. In FIG. 1, the P-N junctions constitute diodes having forward directions from each of the cathode electrodes 16 to the silicon substrate 14. Therefore, even if a current flows from one of the cathode electrodes 16 to the silicon substrate 14, no current flows from the silicon substrate 14 to the other cathode electrodes 16. Accordingly, the P-N junctions electrically isolate two adjacent cathode electrodes 16. It is thus possible to conveniently establish electrical insulation for the silicon cathode layer, having the plural cathode electrodes 16, formed on the silicon substrate 14. It is also possible to reversely bias the P-N junction so that a depletion layer exists around each of the cathode layers 16, the depletion layers electrically isolating every two adjacent cathode electrodes 16.

In this way, according to the present invention, it is possible to electrically isolate two adjacent cathode electrodes 16 by a difference of the respective conductivity types of the semiconductors employed for the cathode electrode layer 16 and for the substrate 14 in which the cathode electrode layer 16 is formed, the semiconductor of the layer 16 having a conductivity type different from that of the substrate 14. The silicon substrate 14 is made of a n-type silicon and the cathode layer 16 is made of a p-type silicon in this embodiment, but it is possible to replace the conductivity types of the silicon substrate 14 and the silicon cathode layer 16; that is, the silicon substrate 14 may be made of a p-type silicon and the silicon cathode layer 16 may be made of an n-type silicon.

FIGS. 5A to 5E show a sequence of steps in the formation of the emitter tip 18 on the p-type semiconductor cathode electrode 16 (or on the n-type semiconductor cathode electrode 16), by etching. As shown in 5A, a circular mask 46 is formed on the cathode electrode 16, at a position where the emitter tip 18 is to be formed. The size of the mask 46 is on the order of a micron, and corresponds to the size of the aperture 24 of FIGS. 1 to 4.

Figure 5A:
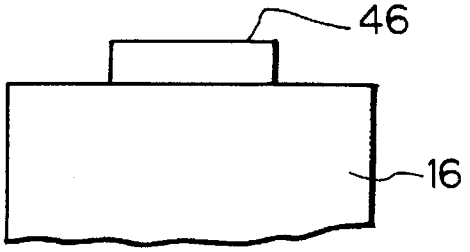
FIGS. 5A to 5E are views illustrating the fabrication, by etching of the field emission cathode device of FIG. 1.
Figure 5B:
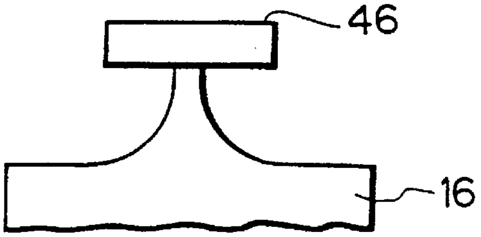
Figure 5C:
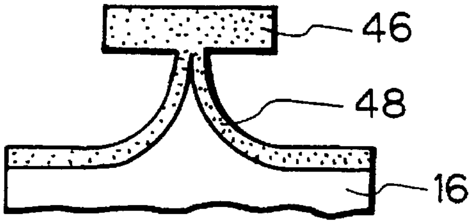

Then an etching process, such as dry etching or isotropic etching, is carried out so that an undercut occurs below the mask 46, as shown in FIG. 5B. Etching is completed before the mask 46 is taken off. Thus, a portion of the surface of the cathode electrode 16 is shaped in the truncated conical shape. Then oxidation, such as thermal oxidation or anode oxidation, is carried out so that a surface portion of the cathode electrode 16 and a peripheral portion of the truncated conical portion become an oxidized portion 48, and the not-oxidized central portion of the truncated conical portion acquires a sharp tip, as shown in FIG. 5C.

Figure 5D:
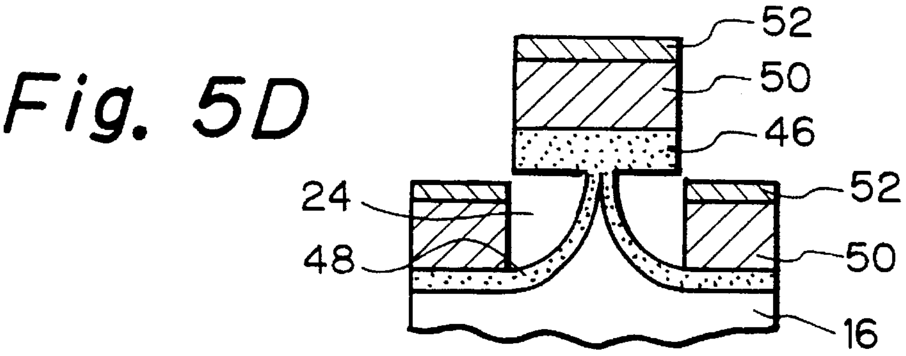
Figure 5E:
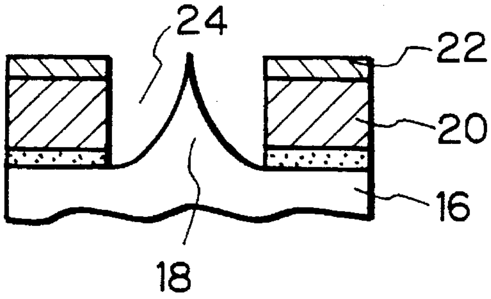

Then the insulating layer 20 and the gate electrode layer 22 are formed. In this case, a layer of a material 50 forming the insulating layer 20 and a layer of a material 52 forming the gate electrode layer 22 are formed by a vapor deposition process, as shown in FIG. 5D. The mask 46 is still carried on the top of the truncated conical portion, so that the layers 50 and 52 are deposited on the cathode electrode layer 16 and the substrate 14 at a region where the mask 46 does not exist, but the layers 50 and 52 are deposited on the mask 46 at a position where the mask 46 exists, with the result that the aligned apertures 24 are automatically formed. Finally, the oxidized portion 48 of the truncated conical portion is selectively etched, and the mask 46 and the layers 50 and 52 thereon are simultaneously removed, as shown in FIG. 5E. In this way, the field emission cathode device 10 can be fabricated.

Figure 6A:
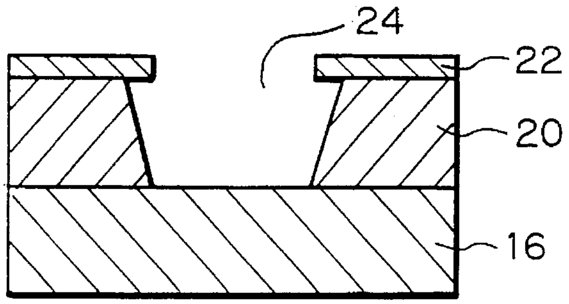
FIGS. 6A to 6D are views illustrating the fabrication by vapor deposition of the field emission cathode device of FIG. 1.
Figure 6B:
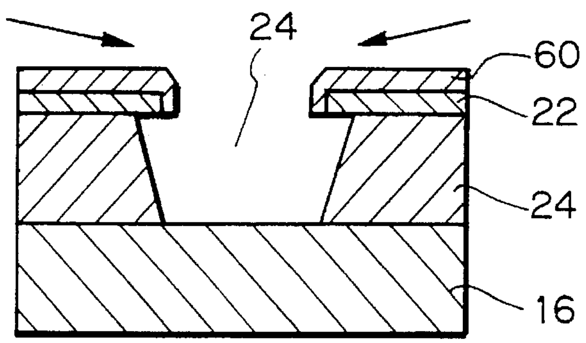
Figure 6C:
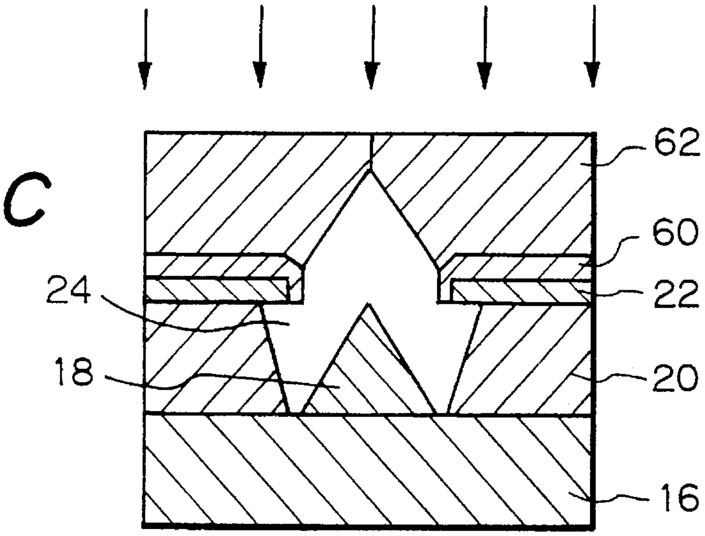
Figure 6D:
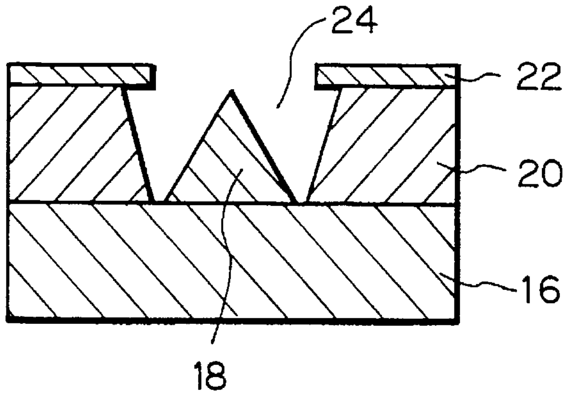

FIGS. 6A to 6D show the formation of the emitter tip 18, on the semiconductor cathode electrode 16, by vapor deposition. In FIG. 6A, the insulating layer 20 and the gate electrode layer 22 are formed on the cathode electrode layer 16 and on the substrate 14, and the aligned aperture 24 is formed in the insulating layer 20 and the gate electrode layer 22 by etching. A sacrifice or sacrificial layer 60 is then formed on the gate electrode layer 22 by vapor deposition, as shown in FIG. 6B. This vapor deposition is carried out in the oblique direction, so that the sacrifice layer 60 reaches (i.e., extends to) the inner surface of the aperture 24. A material 62 for the emitter tip 18 is then deposited by vapor deposition, as shown in FIG. 6C. During this step, the aperture 24 is gradually narrowed by the material 62 for the emitter tip 18, and the emitter tip 18 having the conical shape is formed on the cathode layer 16 within the aperture 24. The sacrifice layer 60 with the material 62 on the layer 60 is finally removed by etching, as shown in FIG. 6D.

Figure 7:
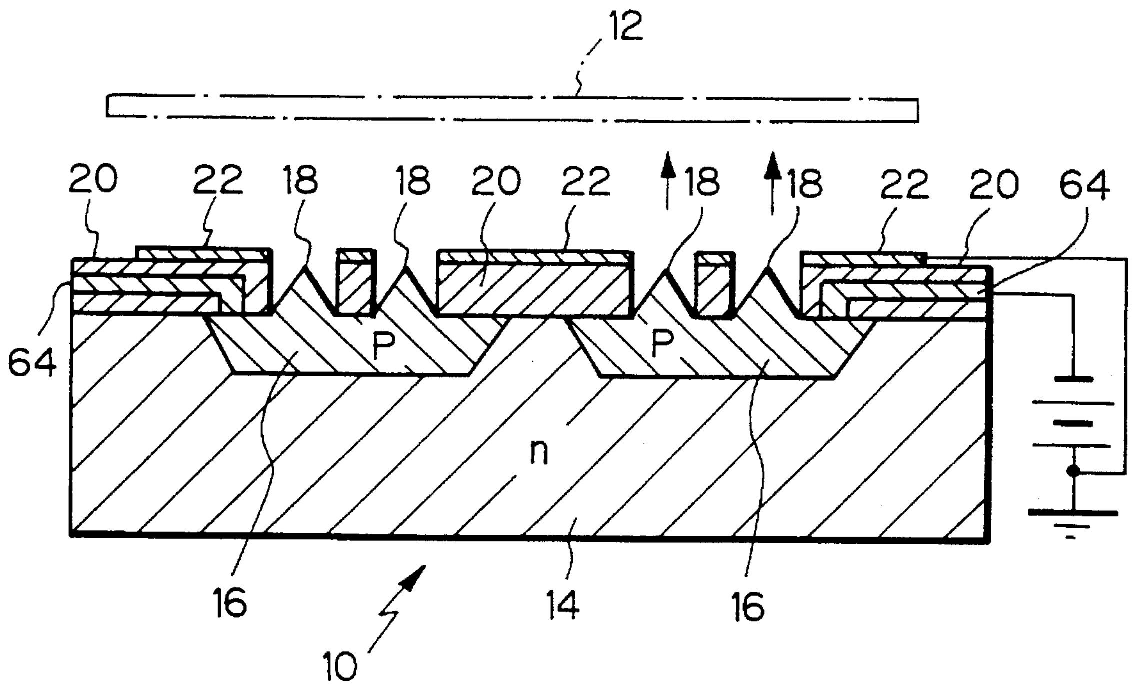
FIG. 7 is a cross-sectional view of a field emission cathode device according to a second embodiment of the present invention.

FIG. 7 shows a field emission cathode device 10 according to the second embodiment of the present invention. Similar to the previous embodiment, the field emission cathode device 10 comprises a n-type silicon substrate 14 and p-type silicon cathode layer having cathode electrodes 16, plural conical emitter tips 18 formed on each of the cathode electrodes 16, and a gate electrode layer 22 formed on an insulating layer 20. The emitter tips 18 are arranged in the corresponding aligned apertures 24 in the insulating layer 20 and the gate electrode layer 22.

In this embodiment, a metal wire pattern 64 connects the cathode electrodes 16 to the power source. The metal wire pattern 64 can be arranged in the insulating layer 20 or in some other insulating layer. If cathode lines are formed by the semiconductor cathode electrodes 16, the resistance of the lines becomes high, however it is possible to prevent a potential drop by arranging the metal wire pattern 64 to extend in parallel to the semiconductor cathode electrodes 16.

Figure 8:
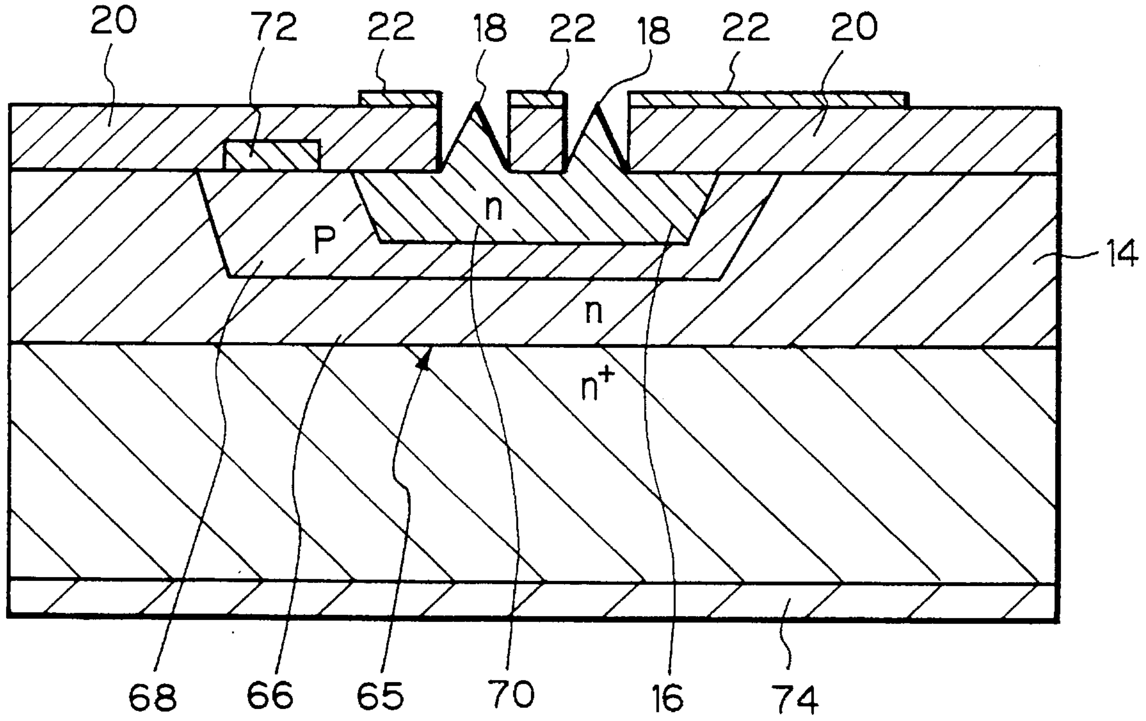
FIG. 8 is a cross-sectional view of a field emission cathode device according to a third embodiment of the present invention.

FIG. 8 shows the field emission cathode device 10 according to the third embodiment of the present invention. In this embodiment, the field emission cathode device 10 is comprised of a transistor 65. The silicon substrate 14 is of the $n^+$-type and the transistor 65 comprises a collector 66 comprising an epitaxially grown layer of n-type silicon on the $n^+$-type silicon substrate 14, a base 68 comprising a layer of p-type silicon, and an emitter 70 comprising a layer of n-type silicon. The emitter 70 is located below the emitter tips 18 and becomes the cathode electrode 16. A cathode line 72 is connected to the base 68 and a power electrode 74 is arranged below the $n^+$-type silicon substrate 14. In this case, therefore, a current for the emitter tip 18 is supplied from the power electrode 74 and it is only necessary to allow a small current to flow through the cathode line 72 so that the potential drop, caused by the current flowing through the cathode line 72, is small.

Figure 9:
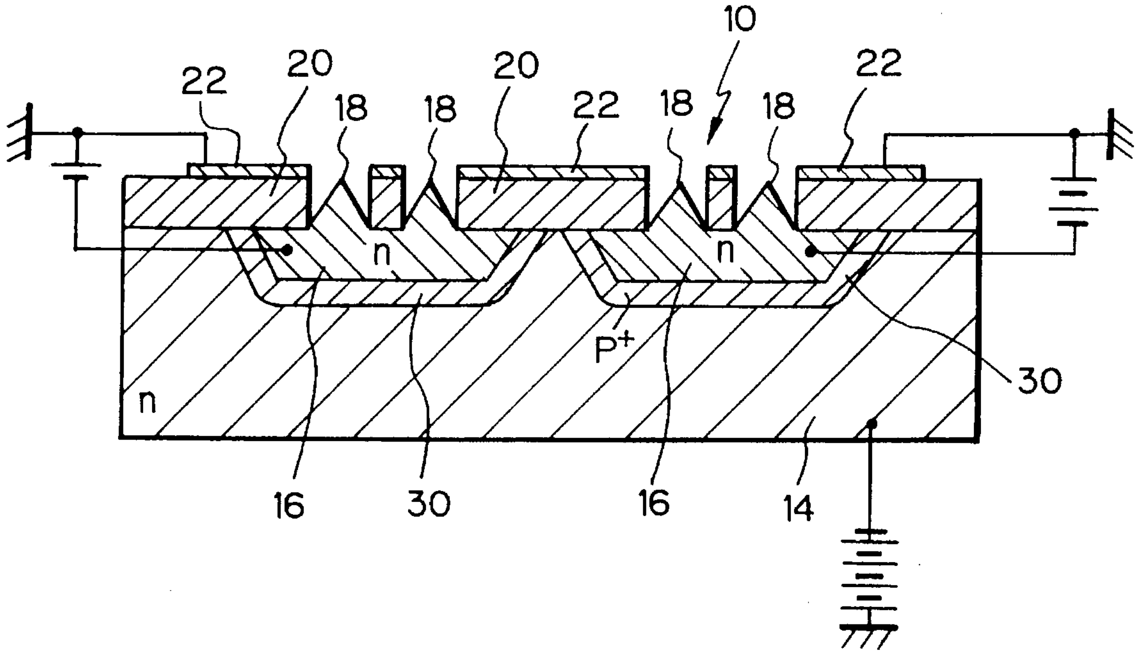
FIG. 9 is a cross-sectional view of a field emission cathode device according to the fourth embodiment of the present invention.

FIG. 9 shows a field emission cathode device 10 according to the fourth embodiment of the present invention. The field emission cathode device 10 comprises a n-type silicon substrate 14 and n-type silicon cathode layer having cathode electrodes 16, conical emitter tips 18 formed on each of the cathode electrodes 16, and a gate electrode layer 22 formed on an insulating layer 20. The emitter tips 18 are arranged in the corresponding aligned apertures 24 in the insulating layer 20 and the gate electrode layer 22.

This embodiment further improves on the electrical isolation of two adjacent cathode electrodes 16, relative to the arrangement of FIG. 1. In the arrangement of FIG. 1, a possibility may exist that the insulation between two adjacent cathode electrodes 16 is not sufficient and that the mobility of the electrons in the substrate 14, at a position between two adjacent cathode electrodes 16, will increase if a relatively high voltage is applied between the cathode electrode 16 and the gate electrode 22.

In FIG. 9, a technique means for electrically isolating two adjacent cathode electrodes 16 comprises means for increasing a threshold voltage, which determines the mobility of electrons in the substrate 14 at a position between two adjacent cathode electrodes 16, when a voltage is applied between one of the cathode electrodes 16 and the gate electrode layer 22.

To this end, a further semiconductor layer 30 is arranged between the substrate 14 and each of the cathode electrodes 16. The further semiconductor layer 30 preferably encloses each of the cathode electrodes 16 within the substrate 14. The cathode electrodes 16 are made of a semiconductor material having the same conductivity type (n-type) as that of the substrate 14. The further semiconductor layer 30 has a conductivity type (p-type) different from that (n-type) of the substrate 14. The further semiconductor layer 30 is heavily doped with an impurity. This arrangement will ensure the electrical isolation. The substrate 14 is shown to be reversely biased, relative to the further semiconductor layer 30, but the substrate 14 is not necessarily biased.

Figure 10:
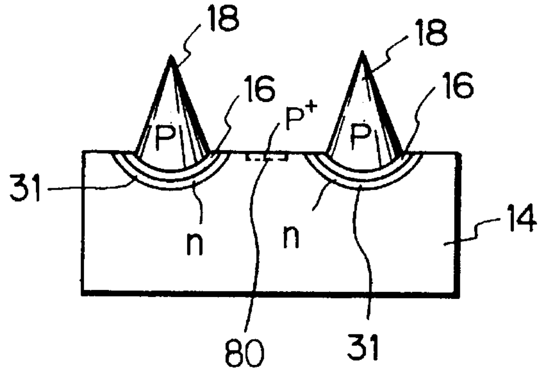
FIG. 10 is a diagrammatic view illustrating a modification to the embodiment of FIG. 9.

FIG. 10 shows a modification to the arrangement of FIG. 9. In FIG. 10, a further semiconductor layer 31 is arranged between the substrate 14 and each of the cathode electrodes 16. The cathode electrodes 16 are made of a semiconductor having the same conductivity type (p-type) as that of the substrate 14, and the further semiconductor layer 31 has a conductivity type (n-type) different from that (p-type) of the substrate 14.

In considering a modification of FIG. 1 in which the substrate 14 is formed of a p-type semiconductor and the cathode electrodes 16 are formed of a n-type semiconductor, a possibility may exist that an inverted layer may be caused at the surface area 80 (shown by dotted line in FIG. 10) of the substrate 14 since the voltage is applied to the gate electrode 22 above the surface area 80, resulting in an insufficient electrical isolation. The arrangement of FIG. 10 solves the problem arising when the substrate is formed of p-type silicon.

Figure 11:
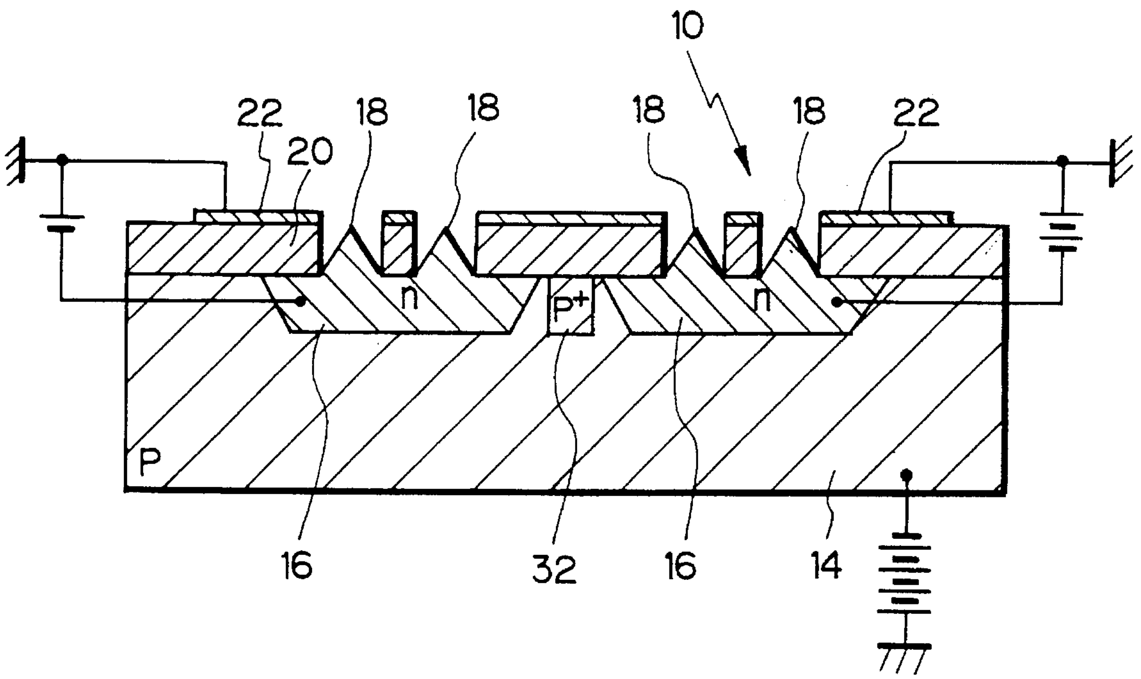
FIG. 11 is a cross-sectional view of a field emission cathode device according to the fifth embodiment of the present invention.

FIG. 11 shows the field emission cathode device 10 according to the fifth embodiment of the present invention. The field emission cathode device 10 comprises a p-type silicon substrate 14 an n-type silicon cathode layer having cathode electrodes 16, conical emitter tips 18 formed on each of the cathode electrodes 16, a gate electrode layer 22 formed on an insulating layer 20. The emitter tips 18 are arranged in the aligned apertures 24 in the insulating layer 20 and the gate electrode layer 22.

In FIG. 11, a portion 32 of the silicon substrate is arranged between two adjacent cathode electrodes 16 to electrically isolate two adjacent cathode electrodes 16. This portion 32 has the same conductivity type (p-type) as that of the substrate but it is heavily doped with an impurity. The portion 32 having the width of 80 μm, and the depth of 10 μm. The substrate 14 is shown to be reversely biased relative to the cathode electrodes 16, but the substrate 14 is not necessarily biased. The arrangement of FIG. 10 solves the problem arising when the substrate is formed of p-type silicon.

Figure 12:
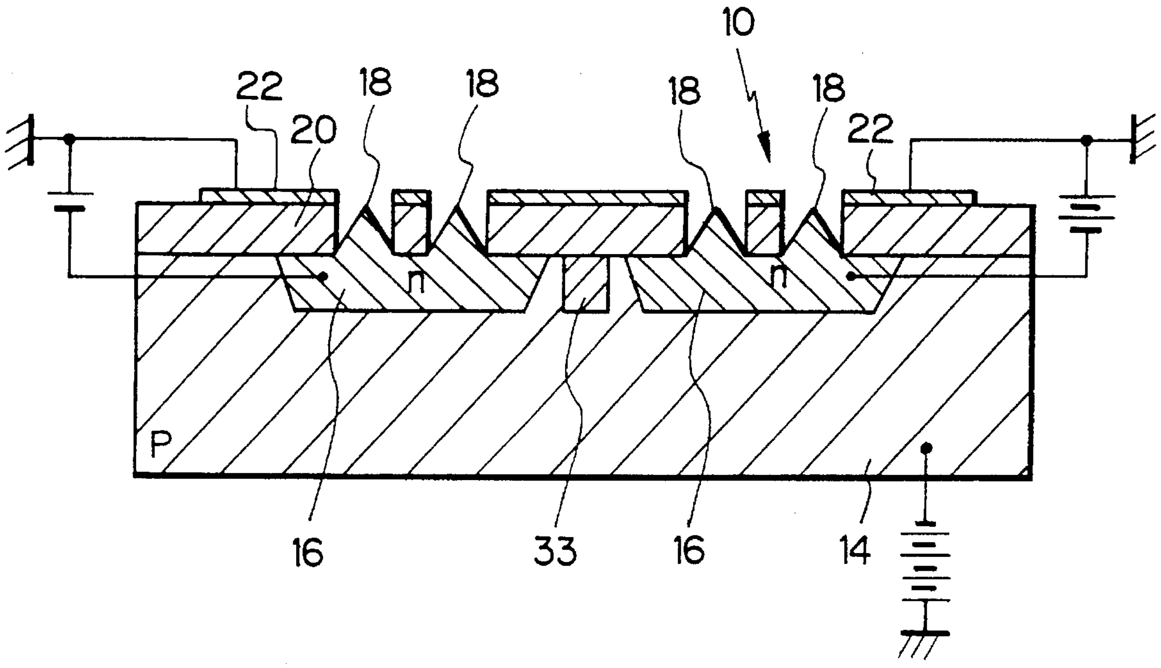
FIG. 12 is a cross-sectional view of a field emission cathode device according to the sixth embodiment of the present invention.

FIG. 12 shows a field emission cathode device 10 according to the sixth embodiment of the present invention. This embodiment is similar to the embodiment of FIG. 11, except that an insulating portion 33, comprising silicon oxide, is arranged in place of the portion 32 of FIG. 11. The substrate 14 is reversely biased or not biased.

Figure 13:
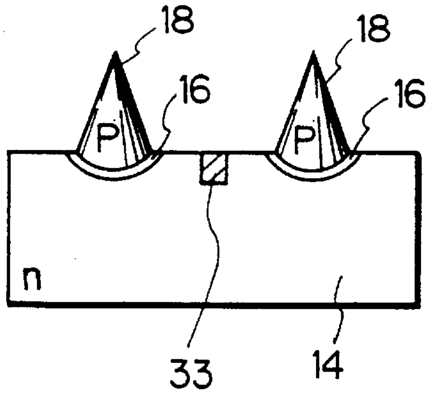
FIG. 13 is a diagrammatic view illustrating a modification to the embodiment of FIG. 12.

FIG. 13 shows a modification to the arrangement of FIG. 12. In FIG. 13, the field emission cathode device 10 comprises a n-type silicon substrate 14, p-type silicon cathode layer having cathode electrodes 16 and an insulating portion 33 between two adjacent cathode electrodes 16.

Figure 14:
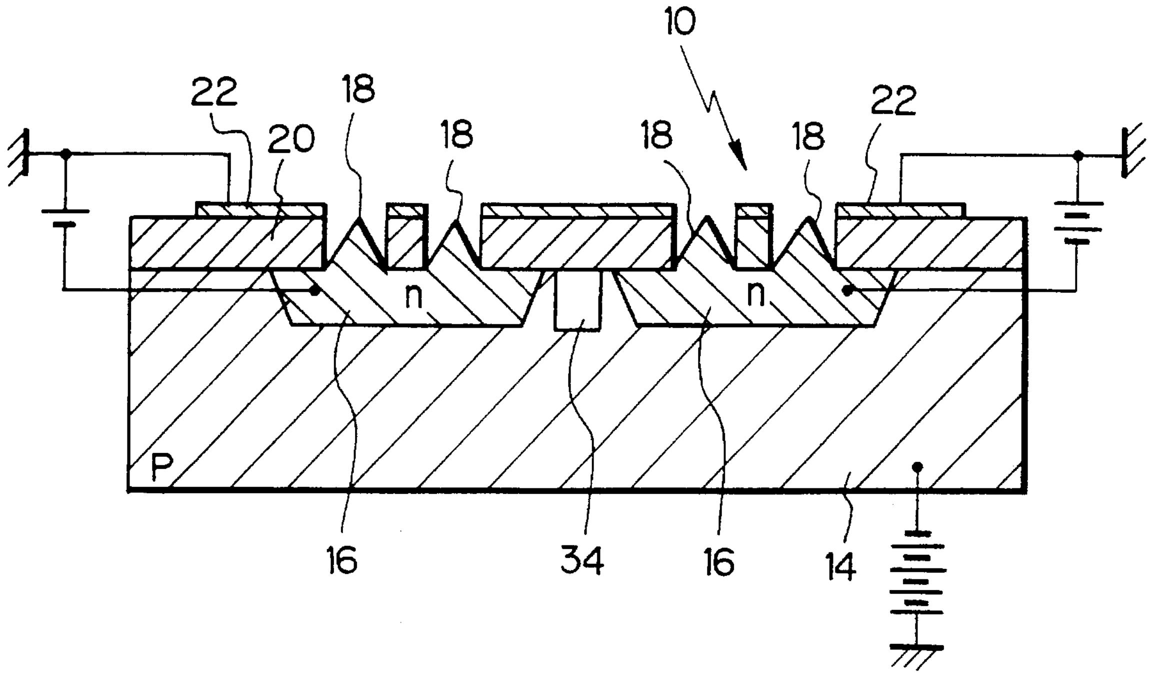
FIG. 14 is a cross-sectional view of a field emission cathode device according to the seventh embodiment of the present invention.

FIG. 14 shows the field emission cathode device 10 according to the seventh embodiment of the present invention. This embodiment is similar to the embodiment of FIG. 11, except that a cavity 34 is arranged in place of the portion 32 of FIG. 11.

Figure 15:
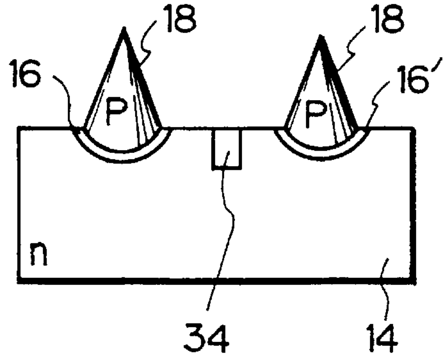
FIG. 15 is a diagrammatic view illustrating a modification to the embodiment of FIG. 14.

FIG. 15 shows a modification to the arrangement of FIG. 14. In FIG. 15, the field emission cathode device 10 comprises a n-type silicon substrate 14, p-type silicon cathode layer having cathode electrodes 16 and a cavity 34.

As explained, according to the present invention, it is possible to use a semiconductor substrate and a semiconductor cathode electrode layer, including a plurality of cathode electrodes which are electrically isolated from each other.

We claim:

1. A field emission cathode device comprising:

a semiconductor substrate;

a cathode electrode layer, of a semiconductor material and formed on the substrate, the cathode electrode layer comprising a plurality of cathode electrodes;

each of the cathode electrodes of the plurality of cathode electrodes further comprising at least one corresponding and integral emitter tip, the respectively corresponding, integral emitter tips of the plurality of cathode electrodes protruding therefrom in a common direction;

an insulating layer formed on the substrate and having a plurality of apertures;

a gate electrode layer, formed on the insulating layer, having a plurality of apertures respectively in alignment with the plurality of apertures of the insulating layer and forming a plurality of pairs of respective, aligned apertures of the gate electrode layer and the insulating layer;

each of the emitter tips being aligned with and extending, in the common direction, into a corresponding aperture pair;

the plurality of cathode electrodes extending in parallel, spaced relationship in a first direction and the gate electrode layer comprising a plurality of gate electrodes extending in parallel, spaced relationship in a second direction on the substrate, substantially perpendicular to the first direction, and defining a plurality of intersecting regions therewith, the field emission cathode device further comprising, at each intersecting region, a corresponding transistor having a collector, a base and an emitter, the emitter comprising the corresponding cathode electrode; and means for electrically isolating the plurality of cathode electrodes from each other.

2. A flat display apparatus comprising a field emission cathode device adapted to emit electrons and a display means for receiving electrons emitted by the field emission cathode device and producing an image thereon in response to the emitted electrons, said field emission cathode device comprising:

a semiconductor substrate of a first semiconductor material and first conductivity type;

a cathode electrode layer of the first semiconductor material and a second conductivity type opposite to the first conductivity type, the cathode electrode layer comprising a plurality of cathode electrodes extending in parallel, spaced relationship to each other in a first direction, each of the cathode electrodes having a plurality of pixel regions thereon, spaced in the first direction;

each of the pixel regions of each of the cathode electrodes further comprising at least one corresponding and integral emitter tip, the respectively corresponding, integral emitter tips of the plurality of cathode electrodes protruding therefrom in a common direction;

an insulating layer formed on the substrate and having a plurality of apertures;

a gate electrode layer formed on the insulating layer and comprising a plurality of strip-like gate electrodes extending in parallel, spaced relationship to each other in a second direction on the substrate, perpendicular to the first direction of the cathode electrodes and defining a matrix of intersecting regions with the cathode electrodes, the gate electrode layer having a plurality of apertures respectively in alignment with the plurality of apertures of the insulating layer and forming a plurality of respective, aligned apertures of the gate electrode layer and the insulating layer, each of the emitter tips being aligned with and extending, in the common direction, into a corresponding aperture pair; and means for electrically isolating the plurality of cathode electrodes from each other.

3. A flat display apparatus according to claim 2, wherein said means for electrically isolating two adjacent cathode electrodes further comprises means for increasing the threshold voltage, which determines the mobility of electrons in the substrate between two adjacent cathode electrodes, when a voltage is applied between one of the two adjacent cathode electrodes and the gate electrode layer to produce emission.

4. A field emission cathode device, comprising:

a semiconductor substrate of a semiconductor material;

a cathode electrode layer comprising a plurality of cathode electrodes defined as respective, integral portions of the semiconductor material of the substrate and which extend in parallel, spaced relationship in a first direction, each of the cathode electrodes of the plurality of cathode electrodes further comprising at least one corresponding and integral emitter tip, the integral emitter tips protruding from respectively corresponding cathode electrodes in a common direction;

an insulating layer formed on the substrate and having a plurality of apertures;

a gate electrode layer formed on the insulating layer and comprising a plurality of gate electrodes which extend in parallel, spaced relationship in a second direction, substantially perpendicular to the first direction of the plurality of cathode electrodes and defining a plurality of intersecting regions therewith, each intersecting region of each gate electrode having a set of plural apertures therein respectively in alignment with a corresponding set of plural apertures, of the plurality of apertures of the insulating layer, and forming a plurality of pairs of respective, aligned apertures of the gate electrode layer and the insulating layer, each of the emitter tips being aligned with and extending, in the common direction, into a corresponding aperture pair and, further, having a corresponding transistor having a collector, a base and an emitter comprising the corresponding cathode electrode, the emitter tip being connected to a cathode electrode line via the base of the transistor; and means for electrically isolating the plurality of cathode electrodes from each other.

5. A field emission cathode device, comprising:

a semiconductor substrate of a semiconductor material;

a cathode electrode layer comprising a plurality of cathode electrodes defined as respective, integral portions of the semiconductor material of the substrate;

each of the cathode electrodes of the plurality of cathode electrodes further comprising at least one corresponding and integral emitter tip, the integral emitter tips protruding from respectively corresponding cathode electrodes in a common direction;

an insulating layer formed on the substrate and having a plurality of apertures;

a gate electrode layer, formed on the insulating layer, having a plurality of apertures respectively in alignment with the plurality of apertures of the insulating layer and forming a plurality of pairs of respective, aligned apertures of the gate electrode layer and the insulating layer, each of the emitter tips being aligned with and extending, in the common direction, into a corresponding aperture pair; and means for electrically isolating the plurality of cathode electrodes from each other and comprising respective, different conductivity types of the integral portions of the respective semiconductor material of the substrate which comprise the cathode electrodes and of the semiconductor material of the substrate.

6. A field emission cathode device according to claim 5, further comprising metal wires arranged in the insulating layer and connecting the cathode electrodes to an external power source.

7. A field emission cathode device comprising:

a semiconductor substrate of a semiconductor material;

a cathode electrode layer comprising a plurality of cathode electrodes defined as respective, integral portions of the semiconductor material of the substrate;

each of the cathode electrodes of the plurality of cathode electrodes further comprising at least one corresponding and integral emitter tip, the integral emitter tips protruding from respectively corresponding cathode electrodes in a common direction;

an insulating layer formed on the substrate and having a plurality of aperture;

a gate electrode layer, formed on the insulating layer, having a plurality of apertures respectively in alignment with the plurality of apertures of the insulating layer and forming a plurality of pairs of respective, aligned apertures of the gate electrode layer and the insulating layer, each of the emitter tips being aligned with and extending, in the common direction, into a corresponding aperture pair; and means for increasing the threshold voltage, which determines the mobility of electrons in the substrate, at a position between two adjacent cathode electrodes when a voltage is applied between a selected one of the cathode electrodes and the gate electrode layer to produce emission from the emitter tip associated with the selected cathode electrode and thereby for electrically isolating the plurality of cathode electrodes from each other.

8. A field emission cathode device according to claim 7, wherein the cathode electrode layer has a conductivity type different from that of the substrate, and said means for increasing the threshold voltage comprises a region of the substrate arranged between two adjacent cathode electrodes and having the same conductivity type as that of the substrate but being more heavily doped with an impurity than the substrate.

9. A field emission cathode device according to claim 7, wherein the cathode electrode layer is formed of a semiconductor having a conductivity type different from that of the substrate, and said means for increasing the threshold voltage comprises an insulating region of the substrate arranged between two adjacent cathode electrodes.

10. A field emission cathode device according to claim 7, wherein the cathode electrode layer has a conductivity type different from that of the substrate, and said means for increasing the threshold voltage comprises a cavity arranged in the substrate between two adjacent cathode electrodes.

11. A field emission cathode device according to claim 7, wherein said means for increasing the threshold voltage comprises a further semiconductor layer arranged in the substrate and enclosing and electrically isolating each of the cathode electrodes from the substrate and from each other and having a conductivity type different from that of the substrate.

12. A field emission cathode device according to claim 11, wherein said further semiconductor layer is heavily doped with an impurity.

13. A field emission cathode device according to claim 11, wherein the cathode electrode layer is of the same conductivity type as that of the substrate.

14. A field emission cathode device according to claim 11, wherein said substrate is reversely biased relative to the further semiconductor layer.

15. A field emission cathode device comprising:

a semiconductor substrate;

a cathode electrode layer, of a semiconductor material and formed on the substrate, the cathode electrode layer comprising a plurality of cathode electrodes;

each of the cathode electrodes of the plurality of cathode electrodes further comprising at least one corresponding emitter tip, the respectively corresponding emitter tips of the plurality of cathode electrodes protruding therefrom in a common direction;

an insulating layer formed on the substrate and having a plurality of apertures;

a gate electrode layer, formed on the insulating layer, having a plurality of apertures respectively in alignment with the plurality of apertures of the insulating layer and forming a plurality of aperture pairs, each aperture pair comprising the respective, aligned apertures of the gate electrode layer and the insulating layer and each of the emitter tips being aligned with and extending, in the common direction, into a corresponding aperture pair; and means for electrically isolating the plurality of cathode electrodes from each other by increasing the threshold voltage, which determines the mobility of electrons in the substrate, at a position between two adjacent cathode electrodes when a voltage is applied between a selected one of the cathode electrodes and the gate electrode layer to produce emission from the emitter tip associated with the selected cathode electrode.

16. A field emission cathode device according to claim 15, wherein said substrate is reversely biased relative to the further semiconductor layer.

17. A field emission cathode device according to claim 15, wherein the cathode electrode layer has a conductivity type different from that of the substrate, and said means for increasing the threshold voltage comprises a region of the substrate arranged between two adjacent cathode electrodes and having the same conductivity type as that of the substrate but being more heavily doped with an impurity than the substrate.

18. A field emission cathode device according to claim 15, wherein the cathode electrode layer is formed of a semiconductor having a conductivity type different from that of the substrate, and said means for increasing the threshold voltage comprises an insulating region of the substrate arranged between two adjacent cathode electrodes.

19. A field emission cathode device according to claim 15, wherein the cathode electrode layer has a conductivity type different from that of the substrate, and said means for increasing the threshold voltage comprises a cavity arranged in the substrate between two adjacent cathode electrodes.

20. A field emission cathode device according to claim 15, wherein said means for increasing the threshold voltage comprises a further semiconductor layer arranged in the substrate and enclosing and electrically isolating each of the cathode electrodes from the substrate and from each other and having a conductivity type different from that of the substrate.

21. A field emission cathode device according to claim 20, wherein said further semiconductor layer is heavily doped with an impurity.

22. A field emission cathode device according to claim 20, wherein the cathode electrode layer is of the same conductivity type as that of the substrate.

* * * * *

UNITED STATES PATENT AND TRADEMARK OFFICE

CERTIFICATE OF CORRECTION

PATENT NO. : 5,572,041

DATED : Nov. 5, 1996

INVENTOR(S) : BETSUI et al.

It is certified that error appears in the above-indentified patent and that said Letters Patent is hereby corrected as shown below:

Col. 1, line 53, after "electrodes" delete "for".

Col. 3, line 38, after "etching" insert --,--.

Col. 4, line 11, change "layer," to --layer--;
line 35, after "16," insert --thereby--.

Col. 6, line 15, after "sacrifice" insert --,--; and after "sacrificial" insert --,--;
line 42, change "high, however" to --high; however,--.

Col. 7, line 4, after "corresponding" insert --,--;
line 15, delete "means";
line 56, after "14" insert --and--.

Col. 10, line 61 (Claim 7, line 12), change "aperture;" to --apertures;--.

Signed and Sealed this

Eighth Day of April, 1997

Attest:

BRUCE LEHMAN

*Attesting Officer*

*Commissioner of Patents and Trademarks*